(12) United States Patent
Ogasawara

(10) Patent No.: US 10,074,515 B2
(45) Date of Patent: Sep. 11, 2018

(54) CHARGED PARTICLE BEAM LITHOGRAPHY METHOD AND CHARGED PARTICLE BEAM LITHOGRAPHY APPARATUS

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

( * ) Notice: Subject to any disclaimer, the term of this patent is extended or adjusted under 35 U.S.C. 154(b) by 30 days.

(21) Appl. No.: 15/183,130

(22) Filed: Jun. 15, 2016

(65) Prior Publication Data

US 2016/0365226 A1    Dec. 15, 2016

(30) Foreign Application Priority Data

Jun. 15, 2015  (JP) ................... 2015-120206

(51) Int. Cl.
*H01J 37/30*     (2006.01)
*H01J 37/317*    (2006.01)
*H01J 37/302*    (2006.01)

(52) U.S. Cl.
CPC ...... *H01J 37/3174* (2013.01); *H01J 37/3026* (2013.01); *H01J 2237/31764* (2013.01); *H01J 2237/31776* (2013.01)

(58) Field of Classification Search
CPC ... H01J 2237/31764; H01J 2237/31776; H01J 37/3026; H01J 37/3174
See application file for complete search history.

(56) References Cited

U.S. PATENT DOCUMENTS

| 7,759,659 B2 | 7/2010 | Abe et al. | |
|---|---|---|---|
| 7,901,850 B2* | 3/2011 | Fujimura | B82Y 10/00 430/296 |
| 2005/0167615 A1* | 8/2005 | Saito | B82Y 10/00 250/492.22 |
| 2009/0057576 A1* | 3/2009 | Abe | B82Y 10/00 250/492.23 |
| 2012/0281191 A1* | 11/2012 | Zable | G06F 17/50 355/52 |
| 2013/0040241 A1* | 2/2013 | Kiuchi | H01J 37/3026 430/296 |
| 2013/0040458 A1* | 2/2013 | Scott | B82Y 10/00 438/669 |

(Continued)

FOREIGN PATENT DOCUMENTS

| JP | 2005-129850 | 5/2005 |
|---|---|---|
| JP | 2009-54945 | 3/2009 |

*Primary Examiner* — Wyatt Stoffa
(74) *Attorney, Agent, or Firm* — Oblon, McClelland, Maier & Neustadt, L.L.P.

(57) ABSTRACT

According to one aspect of the present invention, a charged particle beam lithography method includes forming, such that a shape identical to a first figure pattern obtained using a first charged particle beam having a first resolution can be obtained by superimposing a plurality of second figure patterns, said plurality of second figure patterns that have different widths and are obtained by using a second charged particle beam having a second resolution higher than the first resolution; and performing multiple writing of the plurality of second figure patterns, which are stacked, by using the second charged particle beam.

13 Claims, 11 Drawing Sheets

(56) References Cited

U.S. PATENT DOCUMENTS

| | | | | |
|---|---|---|---|---|
| 2013/0309608 A1* | 11/2013 | Zable | ............ | G06F 17/50 |
| | | | | 430/296 |
| 2014/0245240 A1* | 8/2014 | Tiphine | ............ | H01J 37/3026 |
| | | | | 716/53 |
| 2014/0353526 A1* | 12/2014 | Fujimura | ............ | H01J 37/3177 |
| | | | | 250/492.21 |
| 2015/0020037 A1* | 1/2015 | Fujimura | ............ | B82Y 10/00 |
| | | | | 716/52 |
| 2015/0106772 A1* | 4/2015 | Fujimura | ............ | B82Y 10/00 |
| | | | | 716/52 |
| 2015/0154344 A1* | 6/2015 | Tiphine | ............ | H01J 37/3026 |
| | | | | 716/54 |
| 2015/0261907 A1* | 9/2015 | Fujimura | ............ | G03F 1/20 |
| | | | | 250/492.22 |
| 2016/0013019 A1* | 1/2016 | Platzgummer | ............ | H01J 37/3026 |
| | | | | 250/492.22 |

* cited by examiner

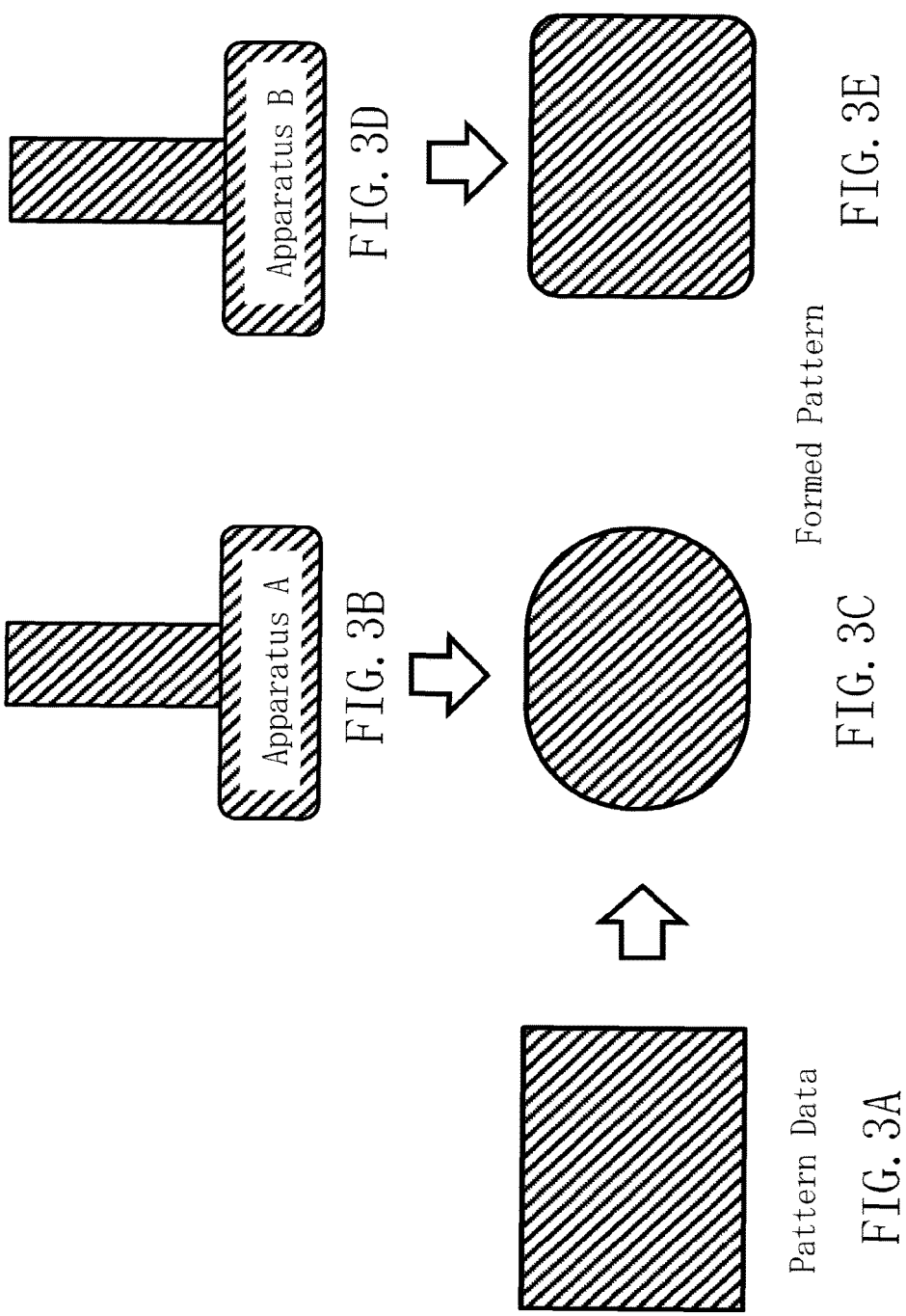

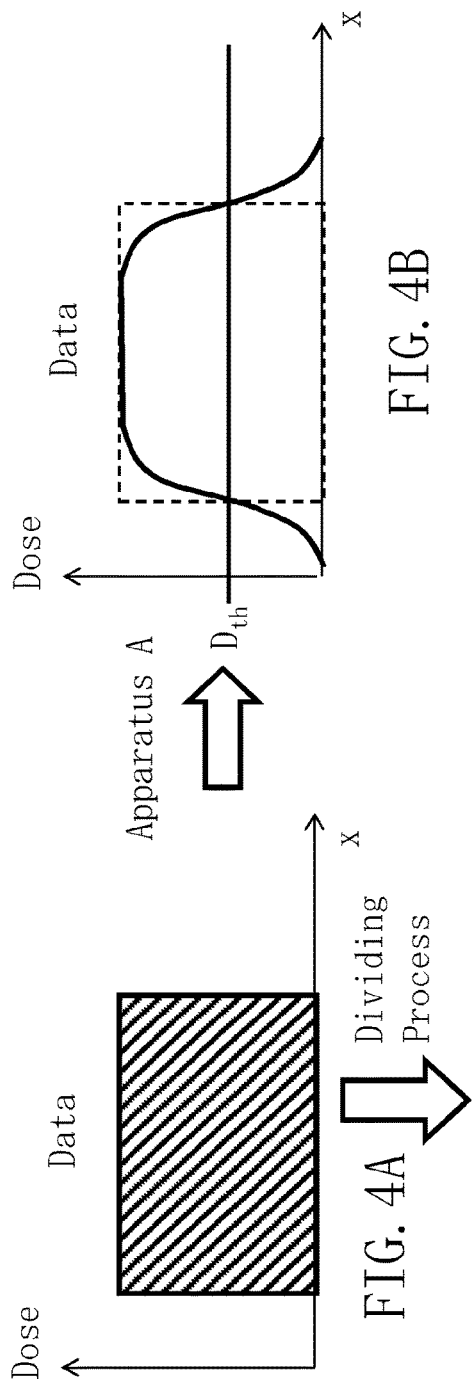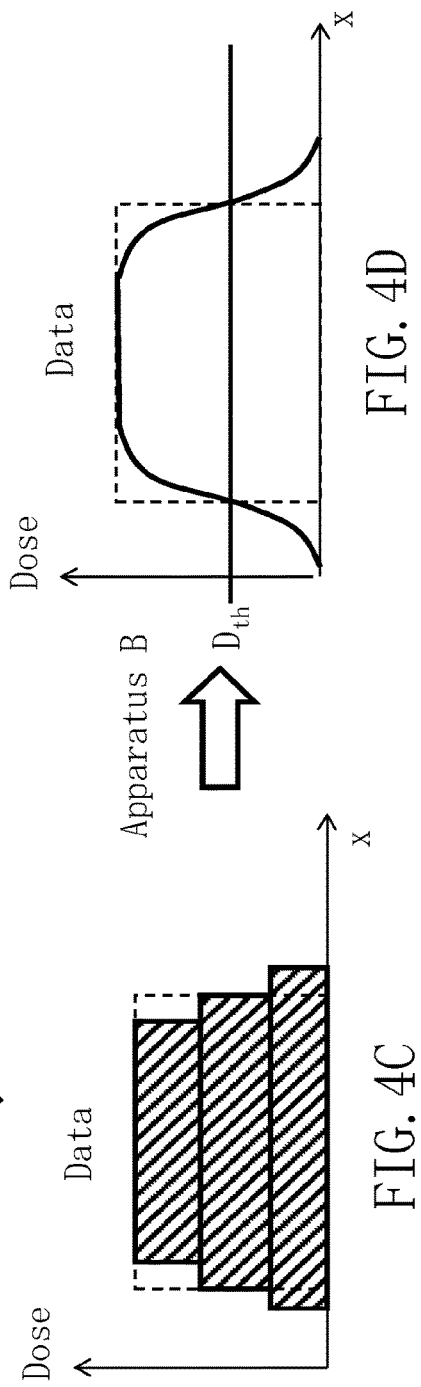
FIG. 4A   FIG. 4B
FIG. 4C   FIG. 4D

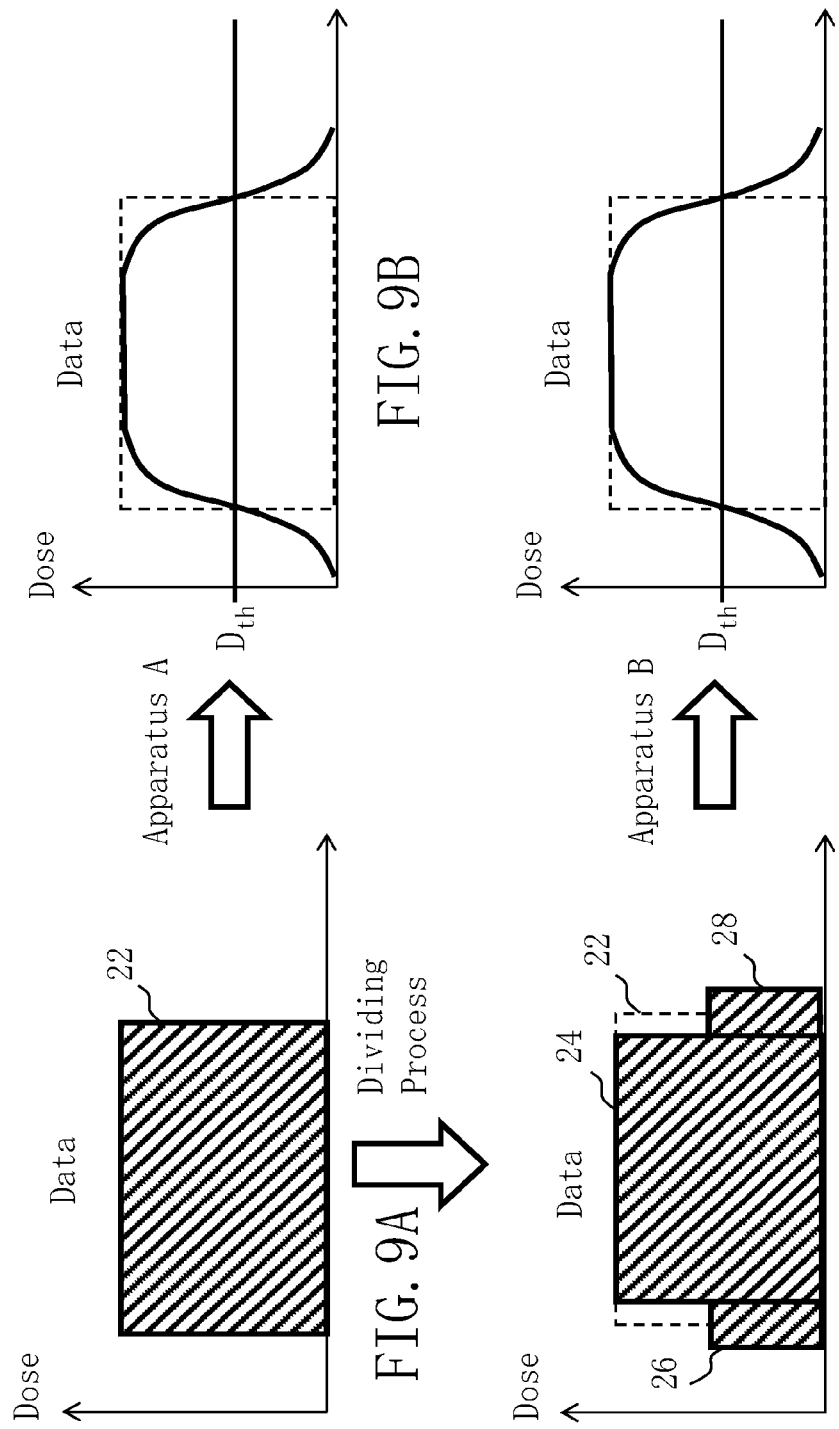

CHARGED PARTICLE BEAM LITHOGRAPHY METHOD AND CHARGED PARTICLE BEAM LITHOGRAPHY APPARATUS

CROSS-REFERENCE TO RELATED APPLICATION

This application is based upon and claims the benefit of priority from prior Japanese Patent Application No. 2015-120206 filed on Jun. 15, 2015 in Japan, the entire contents of which are incorporated herein by reference.

BACKGROUND OF THE INVENTION

Field of the Invention

Embodiments described herein relate generally to a charged particle beam lithography method and a charged particle beam lithography apparatus, and relates to a method relating to adjustment of the resolution of an electron beam in an electron beam lithography apparatus that irradiates the electron beam onto a target object.

Related Art

In recent years, circuit line widths of semiconductor devices are getting still smaller in accordance with high level integration of an LSI. As a method of forming an exposure mask (also referred to as a reticle) for forming circuit patterns on semiconductor devices, an electron beam (EB) lithography technique having an excellent resolution is used.

FIG. 11 is a conceptual view for describing operation of a variable-shaped electron beam lithography apparatus. The variable-shaped electron beam lithography apparatus operates as follows. A first aperture plate 410 is formed with a rectangular opening 411 for forming an electron beam 330. In addition, a second aperture plate 420 is formed with a variable-shaping opening 421 for forming the electron beam 330, which has passed through the opening 411 in the first aperture plate 410, into a desirable rectangular shape. The electron beam 330, which has been irradiated from a charged particle source 430 and has passed through the opening 411 in the first aperture plate 410, is deflected by a deflector, passes through a portion of the variable-shaping opening 421 in the second aperture plate 420, and is irradiated to a target object 340 placed on a stage moving continuously in one predetermined direction (set to X direction, for example). Specifically, a rectangular shape that can pass through both of the opening 411 in the first aperture plate 410 and the variable-shaping opening 421 in the second aperture plate 420 is written on a writing region of the target object 340 placed on the stage moving continuously in X direction. A method for forming an arbitrary shape by causing a beam to pass through both of the opening 411 in the first aperture plate 410 and the variable-shaping opening 421 in the second aperture plate 420 is referred to as a variable-shaping beam method (VSB method).

In the electron beam lithography, great importance is placed on throughput for mask production. However, for various types of evaluation for next-generation lithography development, finer pattern formation is required. Specifically, in such a case, great importance is placed on resolution of a beam.

Increasing beam current density is effective to increase throughput, but increases beam current. Thus, a beam resolution is typically lowered due to Coulomb effect. Coulomb effect largely depends on beam current. Therefore, when the beam current density is low under condition where a beam profile along the orbit is the same, the beam current becomes small, and influence of Coulomb effect becomes small to improve resolution. On the other hand, when the current density is high, influence of Coulomb effect becomes large to deteriorate the resolution.

The resolution also depends on a generation of a lithography apparatus. Lithography apparatuses of newer generations typically have a higher resolution than lithography apparatuses of older generations. However, lithography apparatuses of newer generations do not always write the most advanced pattern only. Those lithography apparatuses also write patterns of a lower resolution that were written in older generations.

As described above, the resolution of a beam unfortunately varies depending on conditions of the beam current or between different lithography apparatuses. Meanwhile, for a process performed on a target object after writing, such as etching, process conditions depending on the beam resolution upon writing is set. In other words, changing the resolution upon writing requires re-optimization of parameters of post processes. Thus, when importance is placed on processes, an identical resolution performance is required for various conditions of emission current, or for various lithography apparatuses.

There is disclosed a technique for forming a pattern having a symmetrical shape with respect to the center line between a first end and a second end by superimposing a beam having a beam profile that has different inclinations at the first end side and the second end side with a beam having a beam profile obtained by inversing the beam profile with the center line as the inversion axis and that has the identical size to the size of the original beam profile. According to the technique, the designed center position of the pattern is not shifted (as disclosed for example in JP-A-2009-054945).

BRIEF SUMMARY OF THE INVENTION

According to one aspect of the present invention, a charged particle beam lithography method includes forming, such that a shape identical to a first figure pattern obtained using a first charged particle beam having a first resolution can be obtained by superimposing a plurality of second figure patterns, said plurality of second figure patterns that have different widths and are obtained by using a second charged particle beam having a second resolution higher than the first resolution; and performing multiple writing of the plurality of second figure patterns, which are stacked, by using the second charged particle beam.

According to another aspect of the present invention, a charged particle beam lithography method includes: forming, such that a shape identical to a first figure pattern obtained using a first charged particle beam having a first resolution can be obtained by adjacently arranging a plurality of second figure patterns, said plurality of second figure patterns that have different widths and are obtained by using a second charged particle beam having a second resolution higher than the first resolution; and writing the plurality of second figure patterns by using the second charged particle beam such that the second figure patterns are adjacently arranged.

According to further aspect of the present invention, a charged particle beam lithography apparatus includes: a pattern forming processing circuitry configured to form, such that a shape identical to a first figure pattern obtained using a first charged particle beam having a first resolution can be obtained by superimposing a plurality of second figure patterns, said plurality of second figure patterns that have different widths and are obtained by using a second charged particle beam having a second resolution higher than the first resolution; and a lithography mechanism including a stage on which a target object is placed, a charged particle beam source, and a deflector and configured to perform multiple writing of the plurality of second figure patterns, which are stacked, by using the second charged particle beam.

BRIEF DESCRIPTION OF THE DRAWINGS

FIGS. 3A to 3E are views for describing differences of formation patterns between different lithography apparatuses according to the first embodiment;

FIGS. 4A to 4D are views illustrating an example of pattern structures of multiple writing and beam profiles according to the first embodiment;

FIGS. 9A to 9D are views illustrating an example of a configuration of adjacently arranged patterns and a beam profile according to a second embodiment;

DETAILED DESCRIPTION OF THE INVENTION

In an embodiment, a method and an apparatus capable of writing using beams similar to a beam having a lower resolution even when a plurality of beams having different beam resolution performances is used is described hereinafter.

In addition, in the embodiment, a structure using an electron beam is described as an example of a charged particle beam is described hereinafter. However, a charged particle beam is not limited to an electron beam but may be a beam using a charged particle, such as an ion beam. Further, a variable-shaped lithography apparatus is described as an example of a charged particle beam apparatus.

First Embodiment

Figure 1:
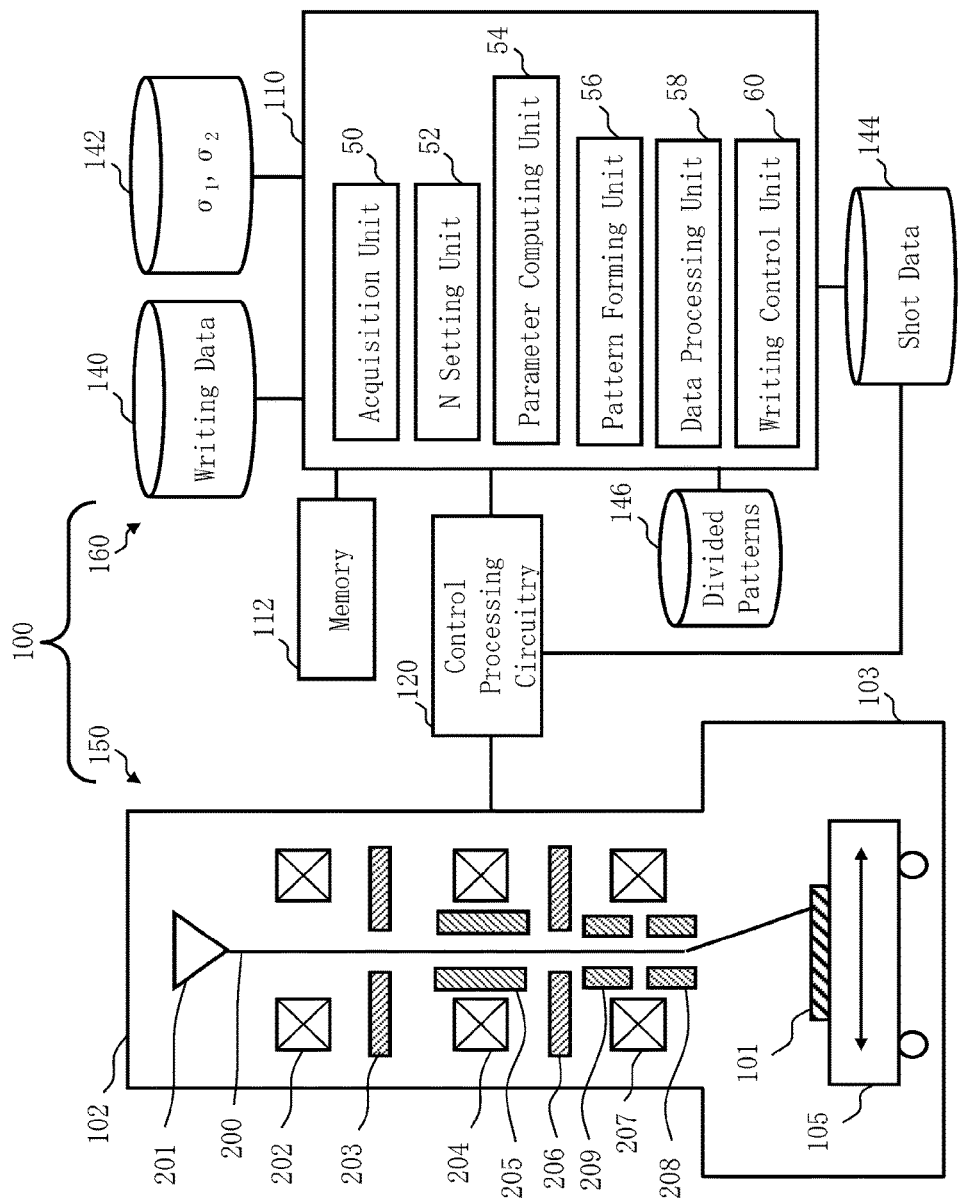
FIG. 1 is a conceptual view illustrating a structure of a lithography apparatus according to a first embodiment.

FIG. 1 is a conceptual view illustrating a structure of a lithography apparatus according to a first embodiment. In FIG. 1, a lithography apparatus (or "writing apparatus") 100 includes a lithography mechanism (or "writing mechanism") 150 and a controller 160. The lithography apparatus 100 is an example of a charged particle beam lithography apparatus (or "charged particle beam writing apparatus"). The lithography apparatus 100 is especially an example of variable-shaped beam (VSB) lithography apparatus. The lithography mechanism 150 includes an electron optical column 102 and a writing chamber 103. Inside the electron optical column 102, an electron gun assembly 201, an illumination lens 202, a first shaping aperture plate member 203, a projection lens 204, a deflector 205, a second shaping aperture plate member 206, an objective lens 207, a main deflector 208, and a sub-deflector 209 are disposed. Inside the writing chamber 103, an XY stage 105 is disposed. A target object 101, such as a mask, to be written is placed on the XY stage 105 when writing. The lithography apparatus 100 writes (or "draws") a pattern on the target object 101. The target object 101 may be an exposure mask used to manufacture a semiconductor device. The target object 101 may be a mask plank on which a resist is applied and nothing is written yet.

The controller 160 includes a control computer 110, a memory 112, a control processing circuitry 120, and storage devices 140, 142, 144, and 146 such as a magnetic disk drive. The control computer 110, the memory 112, the control processing circuitry 120, and the storage devices 140, 142, 144, and 146 are connected via a bus that is not illustrated. The control processing circuitry 120 is connected to the lithography mechanism 150 to control the lithography mechanism 150.

In the control computer 110, an acquisition unit 50, an N setting unit 52, a parameter computing unit 54, a pattern forming unit 56, a data processing unit 58, and a writing control unit 60 are disposed. Each of the units including the acquisition unit 50, the N setting unit 52, the parameter computing unit 54, the pattern forming unit 56, the data processing unit 58, and the writing control unit 60 includes a processing circuitry. As the processing circuitry, an electric circuit, a computer, a processor, a circuit board, a quantum circuit, a semiconductor device, or the like can be used. In addition, each of the units may use a common processing circuitry (the identical processing circuitry). Alternatively, the units may use different processing circuitries (separated processing circuitries). Input data required in the acquisition unit 50, the N setting unit 52, the parameter computing unit 54, the pattern forming unit 56, the data processing unit 58, and the writing control unit 60, or a computation result therefrom is stored in the memory 112 every time.

Note that, FIG. 1 illustrates components required to describe the first embodiment. The lithography apparatus 100 may include other components that are typically required. For example, for position deflection, a multiple-stage deflector of main and sub two-stage deflector including the main deflector 208 and the sub-deflector 209 is used, but a one-stage deflector or a multiple-stage deflector including three or more deflectors can be used for position deflection. In addition, to the lithography apparatus 100, an input device, such as a mouse and a keyboard, a monitor device, and the like may be connected.

Figure 2:
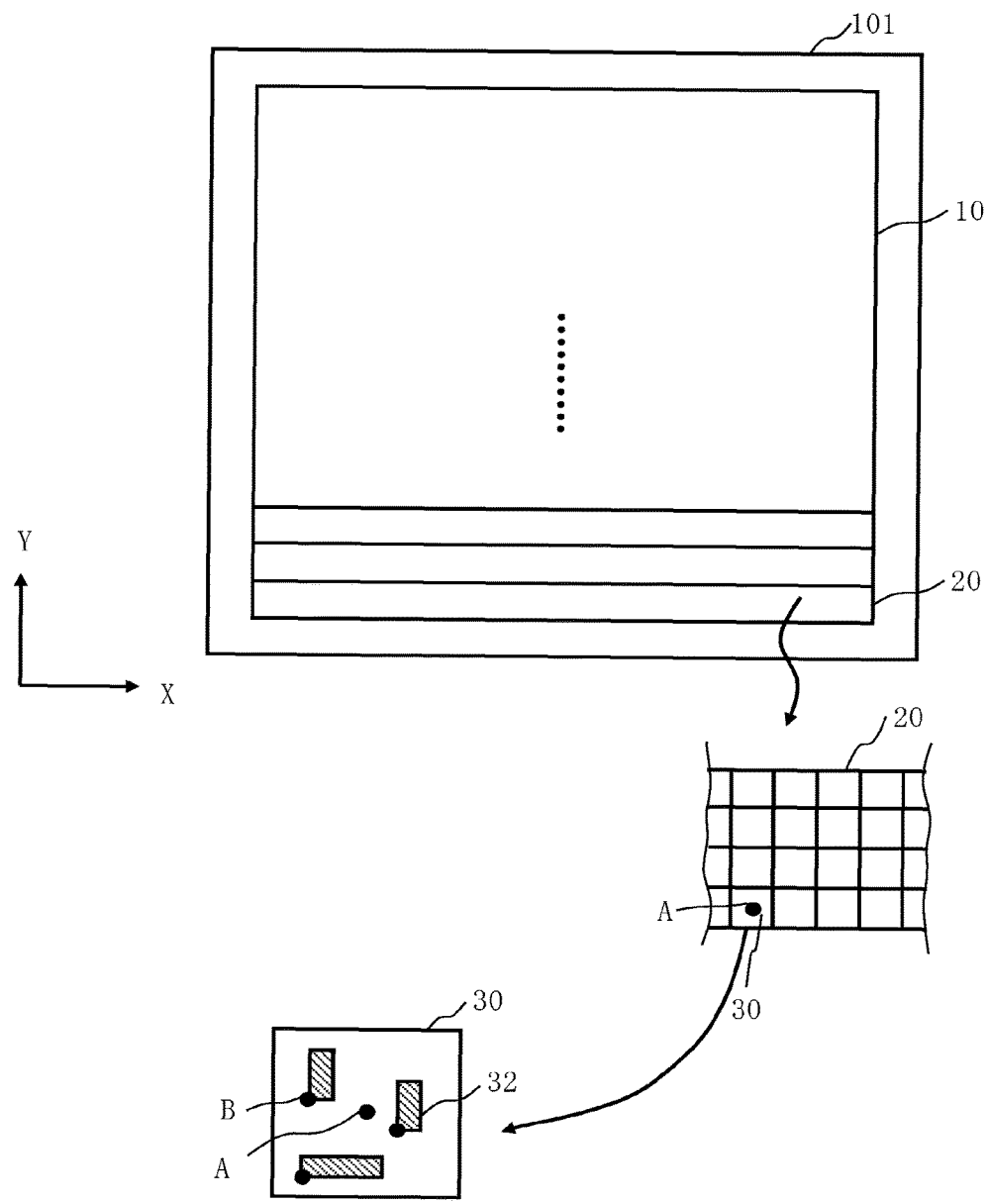
FIG. 2 is a conceptual view for describing each region according to the first embodiment.

FIG. 2 is a conceptual view for describing each region 2 according to the first embodiment. In FIG. 2, a writing region 10 of the target object 101 is virtually divided into a plurality of stripe regions 20 depending on the size of a width that the main deflector 208 can deflect in Y direction. In addition, each of the stripe regions 20 is virtually divided into a plurality of sub fields (SF) 30 (small regions) depending on the size that the sub-deflector 209 can deflect. In a shot position of each of the SFs 30, a shot FIG. 32 is then written.

The control processing circuitry 120 outputs a digital signal for main deflection control to a DAC amplifier that is not illustrated. The DAC amplifier for main deflection control converts the digital signal to an analog signal, amplifies the analog signal, and applies the analog signal as deflection voltage to the main deflector 208. The deflection voltage deflects an electron beam 200. The beam of each shot is thus deflected to a reference position A in a target SF of the SFs 30 obtained by the virtual division into mesh-shape.

The control processing circuitry 120 outputs a digital signal for sub deflection control to a DAC amplifier that is not illustrated. The DAC amplifier for sub deflection control converts the digital signal to an analog signal, amplifies the analog signal, and applies the analog signal as deflection voltage to the sub-deflector 209. The deflection voltage deflects the electron beam 200. The beam of each shot is thus deflected to a reference position B in the target FS of the SFs 30.

The lithography apparatus 100 performs the above process for every stripe region 20 using a multiple-stage deflector including a plurality of stages to advance the writing process. In this embodiment, the two-stage deflector including the main deflector 208 and the sub-deflector 209 is used as an example. For example, the writing is advanced for the first stripe region 20 in X direction while the XY stage 105 sequentially moves in −x direction. After the writing of the first stripe region 20, writing of the second stripe region 20 is advanced similarly or in the opposite direction. Thereafter, writing of the third and the following stripe regions 20 is similarly advanced. The main deflector 208 then deflects the electron beam 200 to the reference positions of the SFs 30 sequentially to follow the movement of the XY stage 105. The sub-deflector 209 then deflects the electron beam 200 from the reference position of each of the SFs 30 to each shot position of the beam irradiated in the SF 30. As described above, the main deflector 208 and the sub-deflector 209 have deflection regions of different sizes. The SFs 30 are the smallest deflection regions in deflection regions of the multiple-stage deflector.

The electron beam 200 emitted from the electron gun assembly 201 (emission part) illuminates a region including the whole opening part of the first shaping aperture plate member 203, which has a rectangular hole due to the illumination lens 202. At this time, the electron beam 200 is first shaped to a rectangle. The electron beam 200 that has passed the first shaping aperture plate member 203 and has the first aperture plate image is projected onto the second shaping aperture plate member 206 due to the projection lens 204. The first aperture plate image on the second shaping aperture plate member 206 is deflection-controlled by the deflector 205 and the beam profile and the size of the first aperture plate image can be changed (variable-shaped). Such variable-shaping is performed for every shot and the beams of the respective shots are typically shaped to have different beam profiles and sizes. The electron beam 200 that has passed the second shaping aperture plate member 206 and has the second aperture plate image is focused by the objective lens 207, deflected by the main deflector 208 and the sub-deflector 209, and irradiated to a desirable position of the target object 101 placed on the XY stage 105. FIG. 1 illustrates an example in which a multiple-stage deflector of main and sub two-stage deflector is used for position deflection. In such a case, the main deflector 208 may deflect the electron beam 200 of the shot to the reference position A of the SF 30 while following the movement of the stage, and the sub-deflector 209 may deflect the beam such that the reference position of the beam of the shot matches with the reference position B (irradiation position) of the each shot figure in the SF. By repeating such operation and combining shot figures of the respective shots, a figure pattern defined by the writing data is written.

A difference between resolutions σ1 and σ2 (first and second resolutions) described above may be caused in a first case where emission current (beam current) values, for example, are different in an identical lithography apparatus and in a second case where different lithography apparatuses are used.

FIGS. 3A to 3E are views for describing differences of formation patterns between different lithography apparatuses according to the first embodiment. In this embodiment, a case where a rectangular pattern, for example, is written as a designed pattern as illustrated in FIG. 3A is assumed. An apparatus A illustrated in FIG. 3B has a lower beam resolution. With the apparatus A, a pattern having four large rounded corners and small linear parts illustrated in FIG. 3C is formed for the designed pattern. On the other hand, an apparatus B illustrated in FIG. 3D has a higher beam resolution. With the apparatus B, a pattern having four linear sides with four small rounded corners illustrated in FIG. 3E is formed for the designed pattern. As described above, when beam resolutions are different between different lithography apparatuses, formed pattern shapes are largely different. Meanwhile, in a process such as etching performed on the target object after writing, a process condition depending on the beam resolution upon writing is set. In other words, change of the beam resolution upon writing requires re-optimization of parameters of post processes. Thus, when importance is placed on processes, an identical resolution performance is required for various conditions of emission current, or for various lithography apparatuses. Therefore, in the first embodiment, a pattern formed by an apparatus having a higher beam resolution or by using a beam obtained under conditions of emission current having a higher beam resolution is matched to a pattern written by an apparatus having a lower beam resolution or by using a beam obtained under conditions of emission current having a lower beam resolution. Specifically, the following is performed.

FIGS. 4A to 4D are views illustrating an example of pattern structures of multiple writing and beam profiles according to the first embodiment. FIG. 4A illustrates a designed pattern (first figure pattern). Here, a case in which a rectangular pattern is written is assumed. When such a rectangular pattern is written by the apparatus having a lower beam resolution or under conditions of emission current having a lower beam resolution, a pattern having a width of a threshold Dth in a threshold model can be formed by a beam having a beam profile that has gentle inclination as illustrated in FIG. 4B. On the other hand, when the rectangular pattern (first figure pattern) illustrated in FIG. 4A is written by the apparatus having a higher beam resolution or under conditions of emission current having a higher beam resolution, multiple writing of stacked multiple figure patterns having different widths (second figure patterns) is performed as illustrated in FIG. 4C. In the example illustrated in FIG. 4C, multiple writing of three rectangular patterns including a rectangular pattern having a smaller width than the rectangular pattern illustrated in FIG. 4A, a rectangular pattern having the identical width to the rectangular pattern illustrated in FIG. 4A, and a rectangular pattern having a wider width than the rectangular pattern illustrated in FIG. 4A is performed. The sum of the doses of the three rectangular patterns illustrated in FIG. 4C is of course similar to the dose of the rectangular pattern illustrated in FIG. 4A. The multiple rectangular patterns can be written in any order. By the multiple writing, the pattern having a width of the threshold Dth in the threshold model can be formed by a beam having a profile that has relatively gentler inclination as illustrated in FIG. 4D than the beam used for one-time writing.

Figure 5:
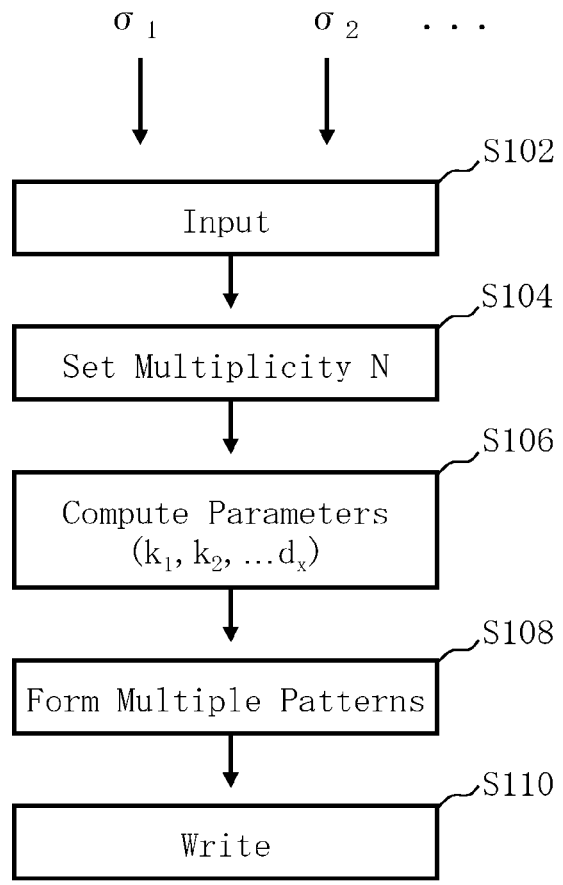
FIG. 5 is a flowchart illustrating main steps of a writing method according to the first embodiment.

FIG. 5 is a flow chart illustrating main steps of the lithography method in the first embodiment. FIG. 5 illustrates a case where a higher beam resolution beam is used to match with a pattern formed by a lower beam resolution beam. As illustrated in FIG. 5, the lithography method according to the first embodiment includes sequential steps including a resolution parameter input step (S102), a multiplicity N setting step (S104), a parameter computing step (S106), a multiple-pattern forming step (S108) and a writing step (S110) are performed.

As the resolution parameter input step (S102), parameters of multiple beam resolutions σ1 and σ2 are input from the outside of the lithography apparatus 100 and stored in the storage device 142 first. The beam resolutions σ1 and σ2 are used to write pattern shapes that are to be matched. In this embodiment, the lithography apparatus 100, which can write with a beam of the higher beam resolution σ2, stores the parameter of the beam resolution σ2 of the apparatus and the parameter of the lower beam resolution σ1 of another lithography apparatus as an example. The acquisition unit 50 then read the parameters of the multiple beam resolutions σ1 and σ2 from the storage device 142 to acquire the parameters.

As the multiplicity N setting step (S104), the N setting unit 52 sets the multiplicity N of the multiple writing using the beam that have the higher beam resolution. The number of times of multiple writing (multiplicity) is preferably two (N=2), or three (N=3), for example.

AS the parameter computing step (S106), the parameter computing unit 54 computes the parameter such that the inclination of the beam profile at the threshold position in the threshold model after superimposing respective beam profiles for figure patterns (second figure patterns) of the number of times of multiple writing (multiplicity) upon multiple writing by using the beam having the higher resolution is matched with the inclination of the beam profile for the figure pattern (first figure pattern) upon writing (for example, one-time writing) by using the beam having the lower beam resolution.

As a premise, a data image function psf(r) is assumed as the following equation (1) using the distance r and the beam resolution σ. A lower resolution means a larger σ, and a higher resolution means a smaller σ. The beam current distribution is assumed to be represented by convolutional integration of a function representing a beam profile and the data image function.

$$psf(r) = \frac{1}{\sigma^2 \pi} e^{-\left(\frac{r}{\sigma}\right)^2} \quad (1)$$

Next, a linear line is assumed as a figure pattern (rectangular pattern, for example) written by using the beam having the resolution σ1. The figure pattern has a width a and a length L where L is sufficiently long so that the linear line can be regarded to have an infinite length. When the center position of the figure pattern is set to x=0, a position x of the end parts (edges) of the figure pattern can be expressed as x=±a/2. The right end part of the pattern center part is now considered. The distribution at a position x=a/2+X, which is close to x=a/2, can be defined as the following equation (2) where a is sufficiently larger than σ (a>>σ).

$$\int_{-\infty}^{\infty} dy' \int_{-a/2}^{a/2} psf\left(\sqrt{(x-x')^2 + y'^2}\right) dx' \approx \quad (2)$$

$$\int_{-\infty}^{\infty} dy' \int_{-\infty}^{a/2} psf\left(\sqrt{\left(\frac{a}{2} + X - x'\right)^2 + y'^2}\right) dx' =$$

$$\frac{1}{\sigma\sqrt{\pi}} \int_{-\infty}^{a/2} e^{-\frac{\left(\frac{a}{2}+X-x'\right)^2}{\sigma^2}} dx' \equiv g\left(\frac{a}{2} + X, \sigma\right)$$

Hereinafter, X is expressed as x for convenience. A distribution function g can be defined as the following equation (3-1) where x≤0, and as the following equation (3-2) where x<0. Note that, erf(z) is an error function defined as equation (3-3).

$$g\left(\frac{a}{2} + x, \sigma\right) = \frac{1}{2}\left(1 - erf\left(\frac{x}{\sigma}\right)\right) \quad (3\text{-}1)$$

$$g\left(\frac{a}{2} + x, \sigma\right) = \frac{1}{2}\left(1 + erf\left(\frac{|x|}{\sigma}\right)\right) \quad (3\text{-}2)$$

$$erf(z) = \frac{2}{\sqrt{\pi}} \int_0^z e^{-\xi^2} d\xi \quad (3\text{-}3)$$

Next, an approximate equation f when the figure pattern (rectangular pattern, for example) to be written using the beam having the lower beam resolution σ1 is written using the beam having the higher beam resolution σ2 is defined. First, an approximate equation f (dx, σ, x) is defined as the following equation (4) using the position x in x direction (pattern width direction) of the threshold in the threshold model, a minute distance dx from the position x, and the beam resolution σ.

$$f(dx, \sigma, x) = g\left(\frac{a}{2} + dx + x, \sigma\right) \quad (4)$$

For example, a case where two-function approximation is performed is described. In the two-function approximation, the number of times of multiple writing (multiplicity) is set to two.

Figures 6A, 6B, 6C:
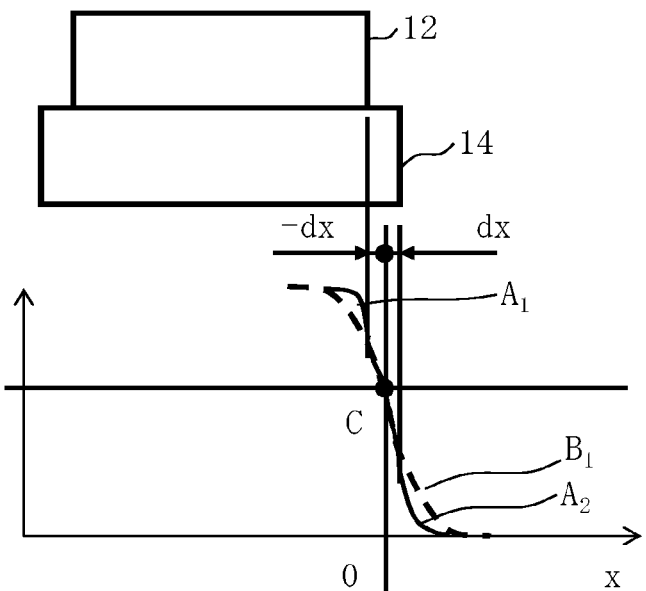
FIGS. 6A to 6C are views illustrating a figure pattern and a beam profile when approximation is performed with the number of times of multiple writing in the first embodiment set to two.

FIGS. 6A to 6C are views illustrating a figure pattern and a beam profile when approximation is performed with the number of times of multiple writing of the first embodiment set to two. FIG. 6C illustrates a figure pattern 16 written by using a beam having the lower beam resolution σ1. The figure pattern 16 has a width a. It is assumed here that the length in the lengthwise direction is sufficiently larger than the width a. In the first embodiment, the figure pattern 16 is approximated by multiple writing of a figure pattern 12 having a width (a−2dx) and a figure pattern 14 having a width (a+2dx) using a beam having the high beam resolution σ2 as illustrated in FIG. 6A. What is required for an approximate equation f of the figure pattern 16 written using the lower beam resolution σ1, the higher beam resolution σ2, an x direction (pattern width direction) position x, a minute distance dx from the position x, and coefficients k1 and k2 with the beam of the lower beam resolution σ1, and an approximate equation f of the figure patterns 12 and 14 written by multiple (twice) writing with the beam of the higher beam resolution σ2 is just to satisfy the following equation (5).

$$f(0,\sigma1,x)=k1\cdot f(-dx,\sigma2,x)+k2\cdot f(+dx,\sigma2,x) \quad (5)$$

The left side of equation (5) indicates a term of the figure pattern 16 written with the beam of the lower beam resolution σ1. The first term on the right side of equation (5) indicates a term of the figure pattern 12, which has a smaller width and is written with the beam of the higher beam resolution σ2. The second term on the right side of equation (5) indicates a term of the figure pattern 14 having a larger width written with the beam of the higher beam resolution σ2. When the center position of the figure patterns is defined as x=0, the position x of the end parts (edges) of the figure pattern 16 is expressed as x=±a/2. In equation (5), the x direction (pattern width direction) position x (a part C illustrated in FIG. 6B) of the threshold Dth in the threshold model is the position x of one of the end parts (edges) of the figure pattern 16, and is expressed as x=a/2. Therefore, equation (5) may hold at x=a/2. At the same time, in order to obtain an identical resolution performance, the inclination of the composite profile of a beam profile A1 of the figure pattern 12 and a beam profile A2 of the figure pattern 14 at x=a/2 needs to match with the inclination of a beam profile B1 of the figure pattern 16 as illustrated in FIG. 6B. In other words, the first order differential value of the left side of equation (5) and the first order differential value of the right side of equation (5) at x=a/2 need to match with each other. Thus, computation is performed using a minute distance dx, and coefficients k1 and k2, which satisfy the condition, as parameters. In addition, the computation may be performed such that the high order differential value of the left side of equation (5) and the high order differential value of the right side of equation (5) at x=a/2 match with each other. For example, the computation may be performed such that the second order differential values match with each other. As described above, relational expressions of the number identical to the number of the unknown variables dx, k1, and k2 are provided. Therefore, the unknown variables dx, k1, and k2 can be calculated from the relational expressions. For example, when σ1=2 and σ2=1, k1=k2≈0.5, and dx=0.83·σ2.

Meanwhile, upon multiple writing of the figure pattern 12 having the width (a−2dx) and the figure pattern 14 having the width (a+2dx) with the beam of the higher beam resolution σ2, the respective incident doses may be set to a half of the incident dose for writing the figure pattern 16 with the beam of the lower beam resolution σ1.

Alternatively, approximation with the number of times of multiple writing in the first embodiment set to 3 as illustrated in FIG. 4C is also preferable. For example, the figure pattern having the width a to be written with the beam of the lower beam resolution σ1 illustrated in FIG. 4A can be approximated by multiple writing of a figure pattern (upper step) having a width (a−2dx), a figure pattern (middle step) having the width a, and a figure pattern (lower step) having a width (a+2dx) as illustrated in FIG. 4C with the beam of the higher beam resolution σ2. What is required for an approximate equation f of the figure pattern written using the lower beam resolution σ1, the higher beam resolution σ2, an x direction (pattern width direction), a minute distance dx from the position x, and coefficients k1, k2, and k3 with the beam of the lower beam resolution σ1, and an approximate equation f of the three figure patterns having different widths written by multiple (three-time) writing with the beam of the higher beam resolution σ2 is just to satisfy the following equation (6).

$$f(0,\sigma1,x)=k1\cdot f(-dx,\sigma2,x)+k2\cdot f(0,\sigma2,x)+k3\cdot f(+dx,\sigma2,x) \quad (6)$$

The left side of equation (6) indicates a term of the figure pattern written with the beam of the lower beam resolution σ1. The first term on the right side of equation (6) indicates a term of the figure pattern, which has the smallest width (the upper step in FIG. 4C) and which is written with the beam of the higher beam resolution σ2. The second term on the right side of equation (6) indicates a term of the figure pattern, which has the width identical to the figure pattern of the left side (the middle step in FIG. 4C) and which is written with the beam of the higher beam resolution σ2. The third term on the right side of equation (6) indicates a term of figure pattern (the lower step in FIG. 4C), which has the larger width and which is written with the beam of the higher beam resolution σ2. When the center position of the figure pattern is defined as x=0, the position x of the end parts (edges) of the figure pattern illustrated in FIG. 4A is expressed as x=±a/2. In equation (6), the x direction (pattern width direction) position x of the threshold Dth in the threshold model is expressed as x=a/2. Therefore, equation (6) may hold at x=a/2. At the same time, in order to obtain an identical resolution performance, the inclination of the composite profile of a beam profile of the figure pattern (the upper step in FIG. 4C), a beam profile of the figure pattern (the middle step in FIG. 4C), and a beam profile of the figure pattern (the lower step in FIG. 4C) at x=a/2 needs to match with the inclination of a beam profile of the figure pattern (FIG. 4A). In other words, the first order differential value of the left side of equation (6) and the first order differential value of the right side of equation (6) at x=a/2 need to match with each other. Thus, computation is performed using a minute distance dx, and coefficients k1, k2, and k3, which satisfy the condition, as parameters. In addition, the computation may be performed such that the high order differential value of the left side of equation (6) and the high order differential value of the right side of equation (6) at x=a/2 match with each other. For example, the computation may be performed such that the second order differential value and the third order differential value match with each other. As described above, relational expressions of the number identical to the number of the unknown variables dx, k1, k2, and k3 are provided. Therefore, the unknown variables dx, k1, k2, and k3 can be calculated from the relational expressions. For example, when σ1=2 and σ2=1, k1=k3≈0.27, k2≈0.47, and dx≈1.66·σ2.

As the multiple pattern formation step (S108), the pattern forming unit 56 forms a plurality of figure patterns (second figure patterns) having different widths obtained by using an electron beam (second electron beam) that has the beam resolution σ2 (second resolution) higher than the beam resolution σ1 so that a shape that is identical to the figure pattern (first figure pattern) obtained with the electron beam 200 (first electron beam), which has the lower beam resolution σ1 (first resolution), can be obtained by superimposing using the parameter dx. Specifically, the pattern forming unit 56 forms the plurality of figure patterns 12 and 14 (divided patterns for superimposition) such that the inclination of the beam profile obtained by superimposing the beam profiles A1 and A2 of electron beams for the plurality of figure patterns 12 and 14 at the position of the threshold Dth matches with the inclination of the beam profile Si of an electron beam for the figure pattern 16. In the example of FIGS. 6A to 6C, the figure pattern 12 having the width (a−2dx) and the figure pattern 14 having the width (a+2dx) are formed. For the figure pattern 12 and the figure pattern 14, the incident doses are set to a half of the figure pattern 16. The pieces of pattern data of the plurality of divided patterns for superimposition, which have been formed, are stored in the storage device 146. In the piece of pattern data of the each divided pattern for superimposition, various types of data including a figure code, coordinates, and size are defined. In addition, dose data for each of the figures can be defined as well. Alternatively, the dose data can be defined in separated file data.

Figure 7:
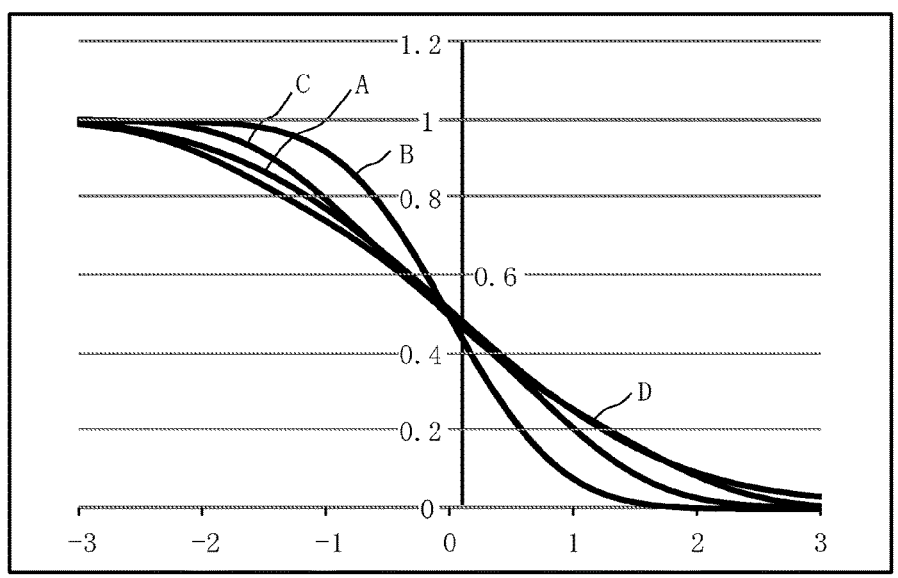
FIG. 7 is a view illustrating an example of simulated comparison result of beam profiles around end parts of figure patterns of the first embodiment.

FIG. 7 is a view illustrating an example of simulated comparison result of beam profiles around end parts of figure patterns of the first embodiment. In FIG. 7, the axis of ordinate is incident dose (relative value), and the axis of abscissas is the position x. In FIG. 7, the x direction positions of the beam profiles at the threshold of the threshold model are set to zero. A graph A gives an example of a beam profile obtained by one-time writing with the electron beam 200 having the lower beam resolution σ1. A graph B gives an example of a beam profile obtained by one-time writing with the electron beam 200 having the higher beam resolution σ2. A graph C gives an example of a beam profile obtained by twice writing (multiple writing) with the electron beam 200 having the higher beam resolution σ2. A graph D gives an example of a beam profile obtained by three-time writing (multiple writing) with the electron beam 200 having the higher beam resolution σ2. As illustrated in FIG. 7, the three-time writing can provide a beam profile close to the beam profile written with the beam having the lower beam resolution σ1 as described above more precisely than the twice writing.

Figure 8:
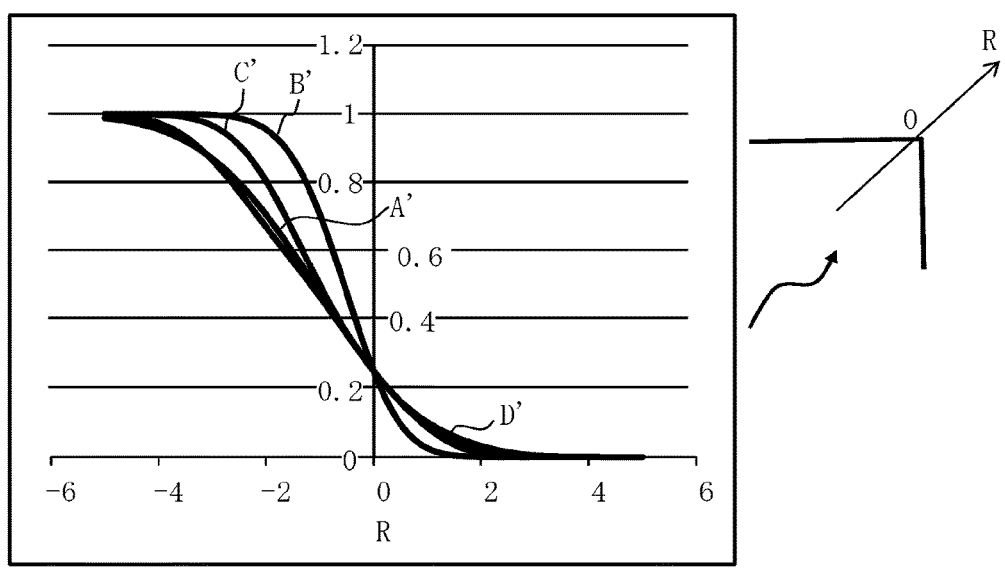
FIG. 8 is a view illustrating an example of simulated comparison result of beam profiles in 45-degree direction around end parts of figure patterns of the first embodiment.

FIG. 8 is a view illustrating an example of simulated comparison result of beam profiles in 45-degree direction around end parts of figure patterns of the first embodiment. In FIG. 8, the axis of ordinate is incident dose (relative value), and the axis of abscissas is the position x. It is desirable to match not only the widths of figure patterns but also the positions of corner parts thereof. FIG. 8 illustrates an example of simulated comparison result of beam profiles in the corner parts. Meanwhile, in FIG. 8, the x direction positions of the beam profiles at the threshold of the threshold model are set to zero. A graph A' gives an example of a beam profile obtained by one-time writing with the electron beam 200 having the lower beam resolution σ1. A graph B' gives an example of a beam profile obtained by one-time writing with the electron beam 200 having the higher beam resolution σ2. A graph C' gives an example of a beam profile obtained by twice writing (multiple writing) with the electron beam 200 having the higher beam resolution σ2. The graph D' gives an example of a beam profile obtained by three-time writing (multiple writing) with the electron beam 200 having the higher beam resolution σ2. As illustrated in FIG. 7, the three-time writing can provide a beam profile close to the beam profile written with the beam having the lower beam resolution σ1 as described above more precisely than the twice writing.

As the writing step (S110), the data processing unit 58 first reads divided patterns for superimposition from the storage device 146. The data processing unit 58 then performs multiple-stage data conversion process to generate shot data specific to the lithography apparatus. Since the beam formation size of the lithography apparatus 100 is limited, it is difficult to irradiate such divided patterns for superimposition (figure patterns) at once. Therefore, the divided patterns for superimposition (figure patterns) are divided by a size that can be formed by the lithography apparatus 100 into a plurality of shot figures. Then pieces of shot data are generated for the respective shot figures. In a piece of shot data, various types of data including a figure code, coordinates, and size are defined. In addition, dose data for each of the figures can be defined as well. Alternatively, the dose data can be defined in separated file data. The pieces of shot data are stored in the storage device 144.

The control processing circuitry 120 then reads the pieces of shot data from the storage device 144, and controls the lithography mechanism 150 according to the pieces of shot data. The lithography mechanism 150 performs multiple writing. In the multiple writing, the plurality of divided patterns for superimposition (second figure patterns) are superimposed by using an electron beam (second electron beam) having the beam resolution σ2 (second resolution) higher than the beam resolution σ1.

As described above, according to the first embodiment, writing can be performed using a beam similar to a beam having a lower resolution even when a plurality of beams having different beam resolution performances is used. Thus, the need for an additional optimization process for process conditions of the post processes that have been optimized for the lower resolution can be eliminated. In a case that a size of shot figure changes, a value of the beam resolution c2 may change. In such a case, a dose or/and widths of the figure patterns 12, 14 may change dependent to the beam resolution σ2.

Second Embodiment

In the first embodiment, divided patterns are formed assuming the multiple writing, but divided patterns may be formed in other ways. In the second embodiment, another configuration is described. In the configuration, divided patterns, which may be adjacently arranged, and which have different widths and different incident doses, are formed. The configuration of the lithography apparatus 100 is identical to the configuration in FIG. 1. The lithography method is also identical to the lithography method in FIG. 5. In addition, points that are not especially described are identical to those of the first embodiment.

FIGS. 9A to 9D are views illustrating an example of a configuration of adjacently arranged patterns and a beam profile according to the second embodiment. FIG. 9A illustrates a designed pattern (first figure pattern). A case where a rectangular pattern 22 is written is assumed here. When the rectangular pattern 22 is written by an apparatus having a lower beam resolution, or under conditions of emission current values having a lower beam resolution, a pattern having a width of the threshold Dth in the threshold model can be formed by a beam having a beam profile having gentle inclination as illustrated in FIG. 9B On the other hand, when the rectangular pattern 22 (first figure pattern) illustrated in FIG. 9A is written by the apparatus having a higher beam resolution or under conditions of emission current having a higher beam resolution, writing of multiple figure patterns 24, and 26 (28), which have different widths and are adjacently arranged, (second figure patterns) is performed as illustrated in FIG. 9C. In the example illustrated in FIG. 9C, writing is performed such that on one end side of the rectangular pattern 24, which has a smaller width than and the incident dose identical to the rectangular pattern illustrated in FIG. 9A, the rectangular pattern 26, which has an even smaller width and a smaller incident dose, is adjacently arranged, and on the other end side of the rectangular pattern 24, the rectangular pattern 28, which has a similarly smaller width and similarly smaller incident dose, is adjacently arranged. The multiple rectangular patterns 24, 26, and 28 can be written in any order. By the writing, the pattern having a width of the threshold Dth in the threshold model can be formed by a beam having a profile that has relatively gentler inclination as illustrated in FIG. 9D than the beam used for writing the single rectangular pattern 22 with the beam of the resolution σ2.

Figure 10A:
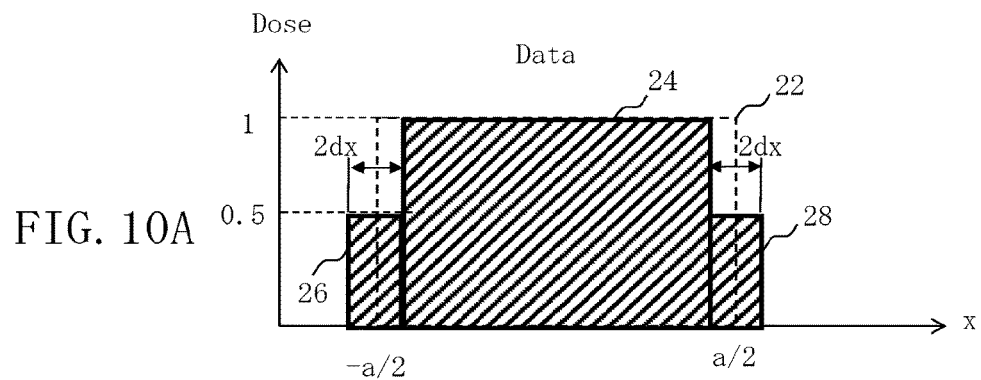
FIGS. 10A and 10B are views for describing how the sizes and the incident doses of the adjacently arranged patterns in the second embodiment can be calculated.
Figure 10B:
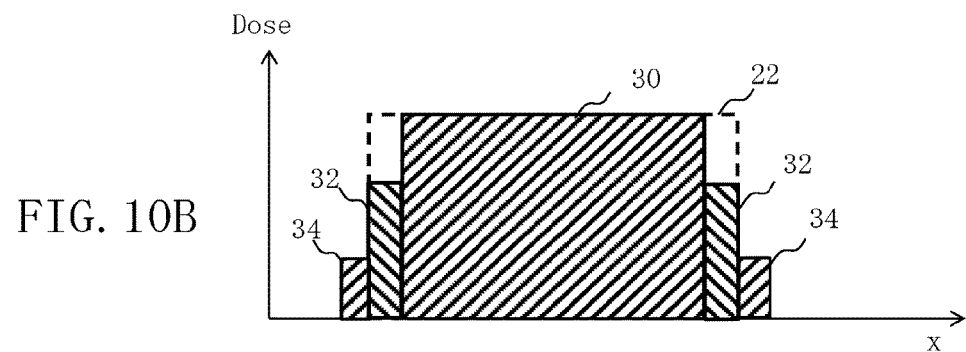
Figure 11:
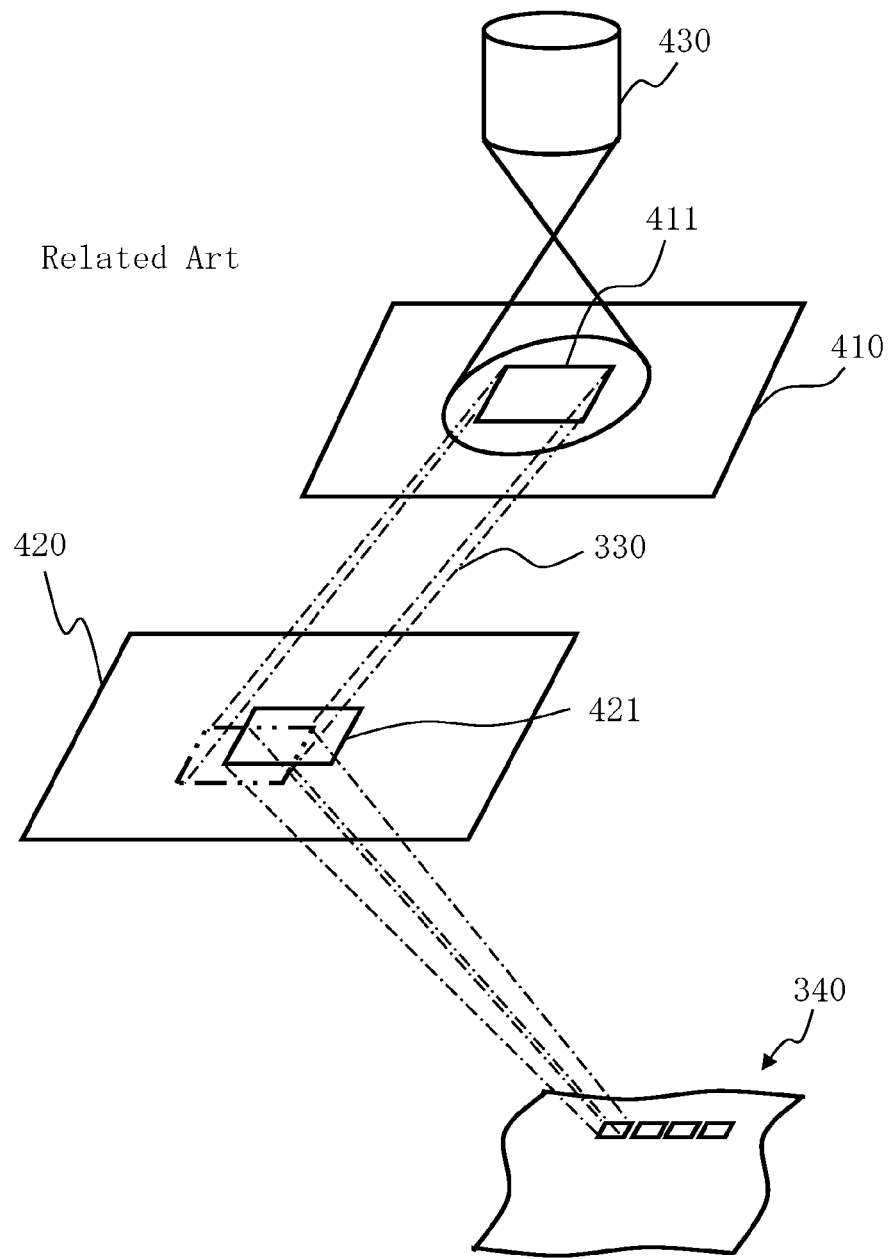
FIG. 11 is a conceptual view for describing operation of a variable-shaped electron beam lithography apparatus.

FIGS. 10A and 10B are views for describing how the sizes and the incident doses of the adjacently arranged patterns in the second embodiment can be calculated. To the example of FIG. 10A, equation (5) for the two-function approximation as described above can be applied. The computation may be performed for both the right and left end parts (edges).

In FIGS. 10A and 10B, the figure pattern 22 is described as a figure having a width identical to the width of the figure in FIG. 4A described in the first embodiment. Similarly to the example of the first embodiment, the center of the figure is set to x=0, and the dose distribution at x=a/2 is considered. The incident dose distribution having been calculated in the first embodiment is k1|k2=1 where x≤a/2−dx, and is k2=0.5 where a/2−dx≤x≤a/2+dx. Therefore, the pattern in the region of x≤a/2−dx may be written with the dose of k1+k2=1, and the pattern having the width of 2dx in the region of a/2−dx≤x≤a/2+dx may be written with the dose of k2=½. In addition, when the end at x=−a/2 is considered in the example of FIG. 10A, the pattern 26 having the width of 2dx in the region of −a/2−dx≤x≤−a/2+dx and the pattern 28 having the width of 2dx in the region of a/2−dx≤x≤a/2+dx may be written with the dose of k2=½, and the pattern 24 having the width of a −2dx in the region of −a/2+dx≤x≤a/2−dx may be written with the dose of k1+k2=1.

Alternatively, the number of adjacently arranged patterns can be increased as illustrated in FIG. 10B. In this case, equation (6) is applied, so that a pattern 34 having the width of dx in the region of −a/2−dx≤x≤−a/2 may be written with k1≈0.27, a pattern 32 having the width dx in the region of −a/2≤x≤−a/2+dx may be written with k1+k2≈0.73, a pattern 30 having the width of a−2dx in the region of −a/2+dx≤x≤a/2−dx may be written with 1, the pattern 32 having the width of dx in the region of a/2−d≤x≤a/2 may be written with k1+k2≤0.73, and the pattern 34 having the width of dx in the region of a/2≤x≤a/2+dx may be written with k1≈0.27. The writing can match up to an even higher order term of the dose distribution.

As the multiple-pattern forming step (S108), the pattern forming unit 56 forms a plurality of figure patterns 24, 26, and 28 (second figure patterns) having different widths obtained by using an electron beam (a second charged particle beam) having the beam resolution σ2 (second resolution) higher than the lower beam resolution σ1 so that a shape that is identical to the figure pattern 22 (first figure pattern) obtained with the electron beam (a first charged particle beam) having the lower beam resolution σ1 (first resolution) by adjacently arranging the figure patterns using the parameter dx. Specifically, from the above computation result, the rectangular pattern 24 can be formed as a pattern having the width of (a−2dx) with the incident dose identical to the incident dose for the figure pattern 22. In addition, the rectangular pattern 26 (and the rectangular pattern 28) can be formed as a pattern having the width of 2dx with an incident dose of a half of the incident dose for the figure pattern 22.

As the writing step (S110), the data processing unit 58 first reads divided patterns for adjacent arrangement from the storage device 146. The data processing unit 58 then performs multiple-stage data conversion process to generate shot data specific to the lithography apparatus. Since the beam formation size of the lithography apparatus 100 is limited, it is difficult to irradiate such divided patterns for adjacent arrangement (figure pattern) at once. Therefore, the divided patterns for adjacent arrangement (figure patterns) are divided by a size that can be formed by the lithography apparatus 100 into a plurality of shot figures. However, each of the small figure patterns 26 and 28 arranged at the end parts are desirably formed as a shot figure of one shot. As described above, the writing is performed such that the incident dose for a figure pattern having a larger width is larger than the incident dose for a pattern having a smaller width.

Then pieces of shot data are generated for the respective shot figures. In a piece of shot data, various types of data including a figure code, coordinates, and size are defined. In addition, dose data for each of the figures can be defined as well. Alternatively, the dose data can be defined in separated file data. The pieces of shot data are stored in the storage device 144.

The control processing circuitry 120 then reads the pieces of shot data from the storage device 144, and controls the lithography mechanism 150 according to the pieces of shot data. The lithography mechanism 150 writes a plurality of divided patterns for adjacent arrangement (second figure pattern) such that the divided patterns are adjacently arranged using an electron beam (second electron beam) that have the beam resolution σ2 (second resolution) higher than the beam resolution σ1.

As described above, according to the second embodiment, writing can be performed using a beam similar to a beam having a lower resolution even when a plurality of beams having different beam resolution performance is used similarly to the first embodiment. Thus, the need for an additional optimization process for process conditions of the post processes that have been optimized for the lower resolution can be eliminated.

The embodiments have been described with reference to specific examples. However the present invention is not limited to the specific examples. For example, the present invention is applicable to a multiple charged particle beam lithography apparatus for writing by using multiple charged particle beams.

In addition, parts that are not required to describe the present invention and include an apparatus configuration and a control method have not been described, but an apparatus configuration and a control method required can be appropriately selected and used. For example, a configuration of a controller that controls the lithography apparatus 100 has not been described, but a required configuration of the controller can be of course appropriately selected and used.

Further, upon applying the present technique, the total dose for writing with the first charged particle beam and the total dose for writing with the second charged particle beam are generally slightly different. Therefore, in calculation of proximity effect correction or fogging correction, correction calculation suited for writing with the second charged particle beam is desirably performed for writing with the second charged particle beam.

Other than the described specific examples, all charged particle beam lithography methods and charged particle beam lithography apparatuses that comprise the components of the present invention and can be obtained by a person skilled in the art through appropriate design change are covered by the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam lithography method comprising:
    performing writing of a first figure pattern using a first charged particle beam having a first resolution and a first beam profile having a first inclination;
    forming a plurality of second figure patterns that have different widths and are obtained by using a second charged particle beam having a second resolution higher than the first resolution and having a second beam profile having a second inclination that is different from the first inclination; and
    performing writing of the plurality of the second figure patterns, which are stacked to overlap each other, by using the second charged particle beam so that the overlapped stacked patterns have the first inclination.

2. The method according to claim 1, wherein the plurality of second figure patterns are formed such that when respective beam profiles of the second charged particle beam for the plurality of second figure patterns are superimposed, an inclination of a beam profile at a position of a threshold in a threshold model after the being superimposed matches the first inclination of the beam profile of the first charged particle beam for the first figure pattern.

3. The method according to claim 1,
    wherein a beam current value of the first charged particle beam having the first resolution and a beam current value of the second charged particle beam having the second resolution are different in an identical lithography apparatus.

4. The method according to claim 1,
    wherein the plurality of second figure patterns include a figure pattern having a width smaller than a designed width of the first figure pattern and a figure pattern having a width larger than the designed width of the first figure pattern.

5. The method according to claim 1,
    wherein a lithography apparatus using the first charged particle beam having the first resolution and a lithography apparatus using the second charged particle beam having the second resolution are different.

6. The method according to claim 1,
    wherein the beam profile is a distribution of an incident dose.

7. A charged particle beam lithography method comprising:
    performing writing of a first figure pattern using a first charged particle beam having a first resolution and a first beam profile having a first inclination;
    forming a plurality of second figure patterns that are adjacently arranged and that have different widths and are obtained by using a second charged particle beam having a second resolution higher than the first resolution and having a second beam profile having a second inclination that is different from the first inclination; and
    writing the plurality of second figure patterns by using the second charged particle beam such that the second figure patterns are adjacently arranged so that the adjacently arranged second patterns have the first inclination.

8. The method according to claim 7,
    wherein the plurality of second figure patterns are formed such that when respective beam profiles of the second charged particle beam for the plurality of second figure patterns are superimposed, an inclination of a beam profile at a position of a threshold in a threshold model after the being superimposed matches the first inclination of the beam profile of the first charged particle beam for the first figure pattern.

9. The method according to claim 7,
    wherein a beam current value of the first charged particle beam having the first resolution and a beam current value of the second charged particle beam having the second resolution are different in an identical lithography apparatus.

10. The method according to claim 7,
    wherein the plurality of second figure patterns include a figure pattern having a width smaller than a designed width of the first figure pattern and a figure pattern having a width larger than the designed width of the first figure pattern.

11. The method according to claim 10,
    wherein the writing is performed such that an incident dose for the figure pattern having the larger width is larger than an incident dose for the pattern having the smaller width.

12. A charged particle beam lithography apparatus comprising:
    a pattern forming processing circuitry configured to form a plurality of second figure patterns that have different widths and are obtained by using a second charged particle beam having a second resolution higher than a first resolution used to write a first figure pattern using a first charged particle beam having a first resolution and a first beam profile having a first inclination, the second charged particle beam having a second beam profile having a second inclination that is different from the first inclination; and
    a lithography mechanism including a stage on which a target object is placed, a charged particle beam source, and a deflector and configured to perform multiple writing of the plurality of second figure patterns, which are stacked to overlap each other, by using the second charged particle beam so that the overlapped stacked patterns have the first inclination.

13. The method according to claim 7,
    wherein a lithography apparatus using the first charged particle beam having the first resolution and a lithography apparatus using the second charged particle beam having the second resolution are different.

* * * * *